United States Patent
Takaoka et al.

(10) Patent No.: US 6,467,426 B1
(45) Date of Patent: Oct. 22, 2002

(54) PHOTOMASK CORRECTION DEVICE

(75) Inventors: Osamu Takaoka; Kazuo Aita, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/701,605
(22) PCT Filed: Apr. 19, 2000
(86) PCT No.: PCT/JP00/02558
§ 371 (c)(1), (2), (4) Date: Jan. 30, 2001
(87) PCT Pub. No.: WO00/65407
PCT Pub. Date: Nov. 2, 2000

(30) Foreign Application Priority Data

Apr. 21, 1999 (JP) .............................. 11-113908

(51) Int. Cl.⁷ ................................. G03F 9/00
(52) U.S. Cl. ................. 118/723 FI; 156/345.24; 156/345.39
(58) Field of Search .................. 118/723 FI; 430/5, 430/22; 156/345.24, 345.39

(56) References Cited

U.S. PATENT DOCUMENTS 6,106,980 A  *  8/2000  Pierrat et al. .................. 430/22

* cited by examiner

Primary Examiner—Thi Dang
(74) Attorney, Agent, or Firm—Adams & Wilks

(57) ABSTRACT

A secondary ion detector 130 senses defects on a photomask and outputs image information. The CPU 140 then displays this image information at a monitor 150. An operator then selects a pattern corresponding to a displayed defect from defect patterns recorded in a memory 120 using an input unit 160, designates a correction region, and designates coordinates for deciding a boundary line for a normal region and a defect. The CPU 140 then automatically determines the defect region using this inputted information and sends the determination results to the focussed ion beam apparatus 110. The focussed ion beam apparatus 110 then corrects the photomask by performing etching or deposition processing on the region indicated by the determination results.

20 Claims, 4 Drawing Sheets

PHOTOMASK CORRECTION DEVICE

BACKGROUND OF THE INVENTION

1. Field of the Invention

The present invention relates to a photomask correction apparatus for correcting defects in photomasks employed, for example, in photolighographic steps for photoconductors.

2. Description Of Related Art:

A photomask is used when, for example, exposing a pattern of a photoresist in a photolithographic step of a semiconductor process. Namely, a desired pattern is exposed by irradiating a film to be subjected to processing, such as a photoresist, with light via a photomask.

A photomask is made by forming a light blocking film pattern on a surface of a transparent substrate. Portions on which the light blocking film is formed then block out light, and these portions of the photoresist etc. are therefore not exposed to light.

There are, however, cases where defects are formed at the surface of the transparent substrate while making the photomask. Such defects consist of clear defects and opaque defects. Clear defects are where a light blocking film is not formed in a place where it was intended to form a light blocking film. On the other hand, opaque defects are where a light blocking film is not formed where it was intended to form the light blocking film.

For example, a focussed ion beam apparatus can be employed as an apparatus for correcting clear defects and opaque defects.

Conventionally, when correction is carried out using this kind of correction apparatus, an operator first designates a region of the photomask to be observed and makes observations on a monitor. When a defect appears, an operator designates coordinates of the region where the defect is formed.

When a defect is a clear defect, the operator operates the correction apparatus so that light blocking film material is deposited on the clear defect region. When a focussed ion beam apparatus is used as a correction apparatus, a light blocking film can be formed on the clear defect region by blowing raw material gas over the photomask while irradiating the clear defect with an ion beam.

On the other hand, when a defect is an opaque defect, the operator operates the correction apparatus so that light blocking film material is removed from the opaque defect region. When a focussed ion beam apparatus is used as a correction apparatus, the opaque defect can be etched away by blowing etching gas over the photomask while irradiating the opaque defect with an ion beam.

It is therefore possible to make a highly reliable photomask by correcting defects in this manner.

With related photomask correction technology, it is necessary for an operator to input the coordinates of regions where defects are formed into the photomask correction apparatus using a monitor.

However, when a normal region of a light-blocking film and a defect overlap, it is difficult to discern the border of the normal region and the defect region on a monitor. This has the drawback that related photomask correction technology places an enormous workload on the operator.

In order to resolve the aforementioned problems, it is an object of the invention to provide a photomask correction apparatus capable of alleviating the workload placed on an operator at the time of correcting defects.

SUMMARY OF THE INVENTION

The photomask correcting apparatus of this invention for correcting defects in light blocking film formed on a surface of a photomask comprises storage means for storing positional relationships between the defects of the photomask and normal regions as one type or a plurality of types of patterns; sensing means for generating image information for the photomask; and determining means for determining a region for the defect using the patterns inputted from the input means and the image information inputted from the sensing means.

According to this invention, it is possible to identify a boundary line between a normal region and a defect using a pattern indicating the positional relationship of the blocking film defect and a normal region, and image information, and thus alleviate the workload involved in correcting defects.

DETAILED DESCRIPTION OF THE PREFERRED EMBODIMENT

Figure 1:
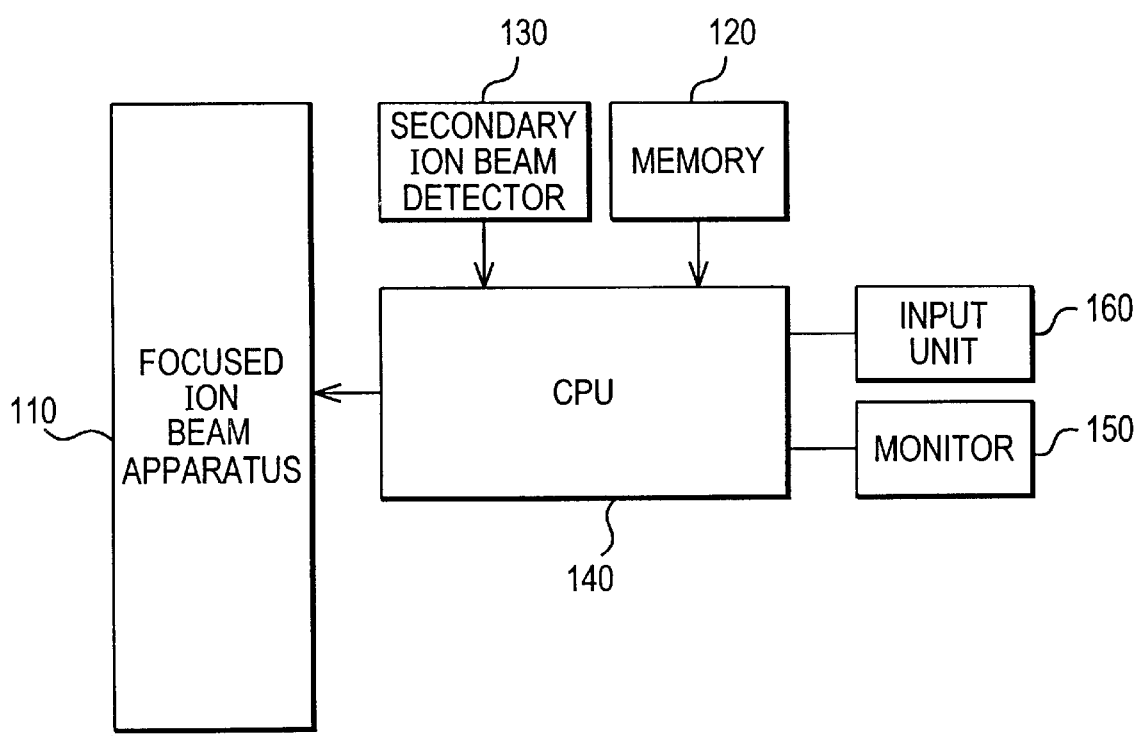
FIG. 1 is a block view functionally showing an outline of a configuration for a photomask correcting apparatus of an embodiment according to the present invention.

An embodiment of this invention is described in the following using the drawings. In the drawings, the size, shape, and positional relationship of each structural component are provided in an approximate manner to aid in the understanding of this invention, and by no means illustrate numerical conditions described in the following.

FIG. 1 is a block view functionally showing an outline of a configuration for photomask correcting apparatus of an embodiment according to the present invention.

In FIG. 1, a focussed ion beam apparatus 110 performs deposition and etching processing in order to correct defects in a light blocking film formed on the surface of the photomask.

A memory 120 stores positional relationships of defects and normal regions of a photomask for a plurality of kinds of defect patterns described later. In this embodiment, spots, lines, corners an ridges are stored in the memory 120 as detect patterns (described later with reference to FIG. 2).

A secondary ion beam detector 130 generates image information for a photomask by detecting secondary beam ions.

A CPU (Central Processing Unit) 140 takes defect patterns form the memory 120 and image information for the photomask from the secondary ion beam detector 130 as input. A defect region is then determined thereafter. The monitor 150 displays a photomask image and a defect pattern image.

The input unit 160 is used when the operator designates a defect pattern or designates a correction region.

A keyboard and a mouse etc. can be used as the input unit 160.

Figure 2:
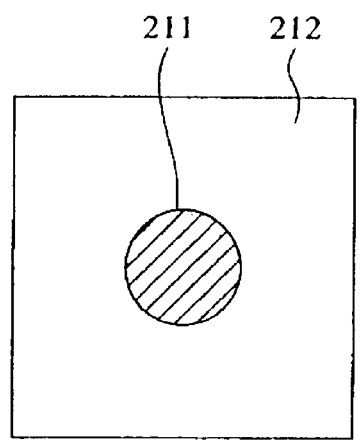
FIG. 2 is a conceptual view showing an example of an opaque defect pattern used in this embodiment.
Figure 2:
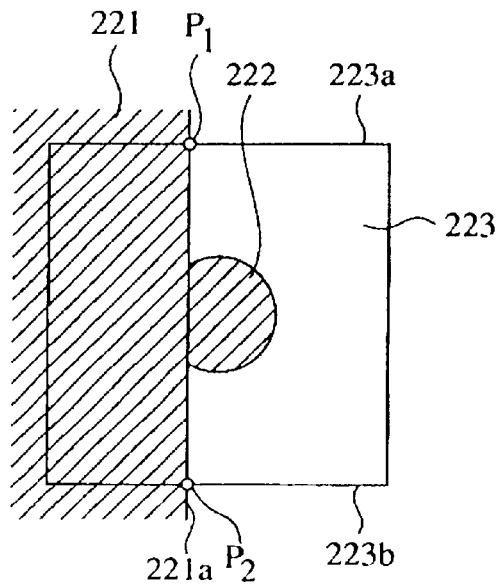
Figure 2:
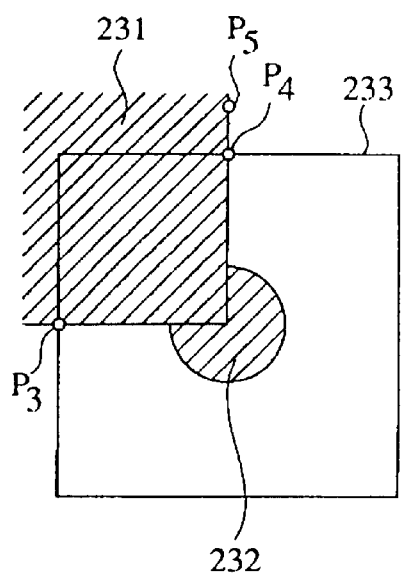
Figure 2:
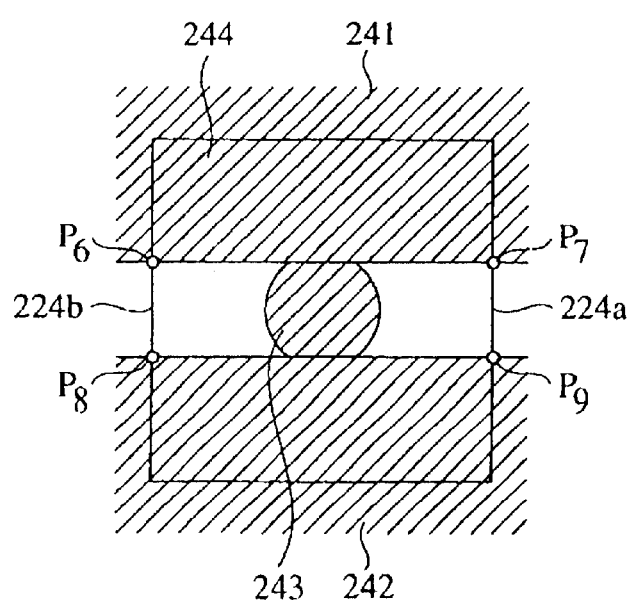

FIG. 2 is a conceptual view showing an example of an opaque defect pattern stored in the memory 120. FIG. 2(A) shows a spot pattern. With this defect pattern, the defect 211 and the normal region (not shown) do not overlap. The correction region 212 is designated by the operator as described in the following.

FIG. 2(B) shows a line pattern 221. At this defect pattern, the line pattern 221 of the normal region and the defect 222 overlap. The correction region 223 and coordinate points P1 and P2 are designated by the operator.

FIG. 2(C) shows a corner pattern. At this defect pattern, the corner pattern 231 of the normal region and the defect 232 overlap. The correction region 233, coordinate points P3, P4 and P5 and an angle of the corner are designated by the operator.

FIG. 2(D) shows a bridge pattern. At this defect pattern, two line patterns 241 and 242 of the normal region and a defect 243 overlap. The correction region 244 and coordinate points P6, P7, P8 and P9 are designated by the operator as described later.

Defect patterns for clear defects are also substantially the same as for the kind of opaque defect patterns shown in FIG. 2, with the exception that the presence or absence of the light blocking film is reversed.

Figure 3:
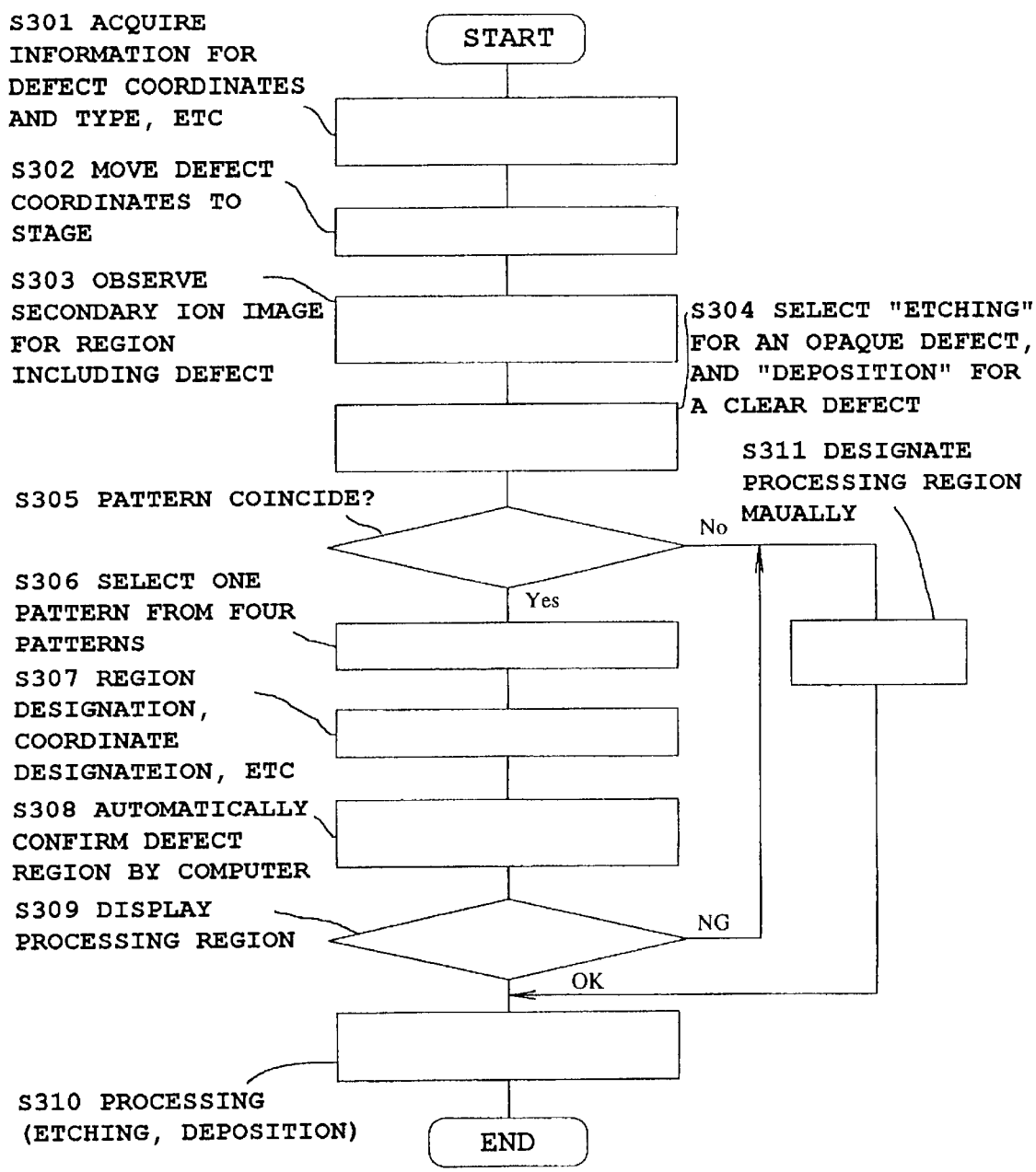
FIG. 3 is a flowchart illustrating the operation of a photomask correcting apparatus for the embodiment.

Next, a procedure for correcting a defect using the photomask correction apparatus of this embodiment is described using FIG. 1 to FIG. 3.

First, an operator mounts a photomask on a focussed ion beam apparatus stage (not shown).

Next, the CPU 140 acquires the position of a region thought to be a defect and information for distinguishing clear and opaque defects from a defect scanning apparatus (not shown). A defect scanning apparatus is an apparatus for detecting defects on the photomask using an optical system. Such defect scanning apparatus are publicly known and a detailed description thereof is omitted.

The CPU 140 then finally selects the defect to be corrected using information from the defect scanning apparatus. The position of the photomask is then moved using the stage (refer to S302) and the selected defect is sensed at the secondary ion beam detector 130 (refer to S303). At this time, the CPU 140 displays a defect image acquired by the secondary ion detector 130 on the monitor 150.

The CPU 140 then requests the operator to select etching or deposition using the monitor 150 (S304). The operator then determines whether a defect is a clear defect or an opaque defect using the display image of the monitor 150. The operator then selects deposition in the case of clear defects, and etching in the case of opaque defects using the input unit 160.

Next, the CPU 140 requests the operator (S305) to determine which of the defects (refer to FIG. 2) this defect is, using the monitor 150. The operator then inputs the determination results to the CPU 140 using the input unit 160.

When coincidence is determined in step S305, the CPU 140 requests the operator (S306) to designate a defect pattern corresponding to this defect using the monitor 150. The operator then designates one of the defect patterns of spot, line, corner and bridge recorded in the memory 120 using the input unit 160.

When a defect pattern is designated, the CPU 140 requests the operator to designate a correction region and point coordinates (S307). When a corner pattern is designated as the defect pattern, a request is also made to the user to designate a corner angle in addition to the correction region and the point coordinates using the CPU 140.

Figure 4:
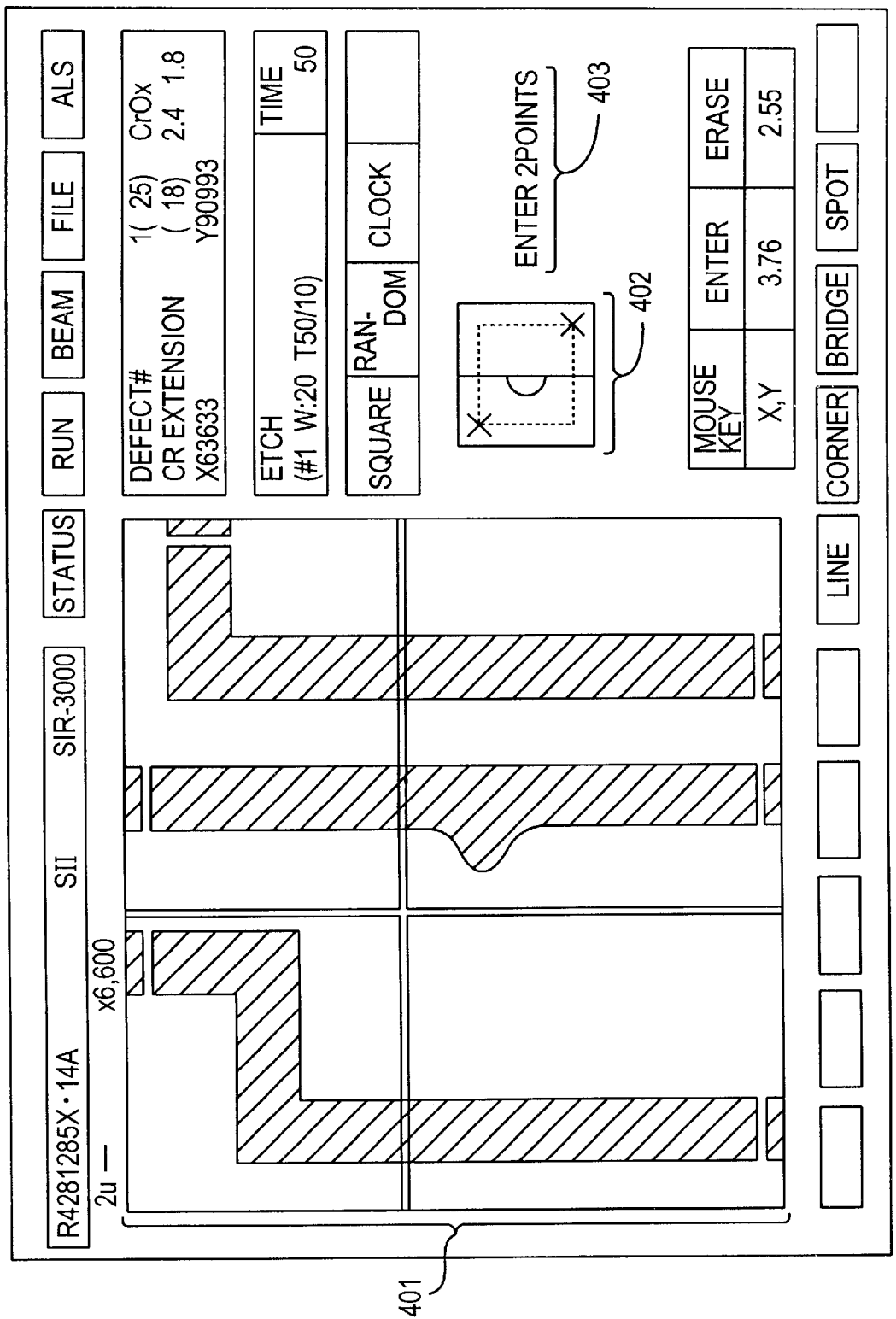
FIG. 4 is a conceptual view showing an example display screen for the monitor used in this embodiment.

FIG. 4 is an outline view showing a display screen example for the monitor 150 at this time. In FIG. 4 shows the case where etching is selected in step S304, "coincidence" is selected in step S305, and line pattern is selected in step S306. As shown in FIG. 4, an image sensed by the secondary ion beam detector 130 is displayed at the screen region 402. A display indicating a request to input coordinates is displayed at the screen region 403.

The operator then designates, for example, a correction region by inputting coordinates for two opposing vertexes of the correction region.

When the defect pattern is a spot pattern (refer to FIG. 2(A)), the operator makes a designation in such a manner that no point of intersection exists for a side of the correction region 212 and a side of the normal region.

In the case of a line pattern (refer to FIG. 2(B)), the operator makes designations in such a manner that two opposing sides 223a and 223b of the correction region 223 cross over at two points (i.e. points P1 and P2) with the side 221a of the normal line pattern 221. The coordinates of these points P1 and P2 are designated by the operator.

In the case of a corner pattern (refer to FIG. 2(C)), the operator makes designations in such a manner that two neighboring sides 233a and 233b of the correction region 233 cross over at two points (i.e. points P3 and P4) with two neighboring sides 231a and 231b of the normal line pattern 231. The coordinates of these points P3 and P4 are designated by the operator. In the case of this pattern, in addition to the coordinates for the points P3 and P4, a further arbitrary point on the normal line pattern 231 and the angle of the corner are designated by the operator.

In the case of a bridge pattern (refer to FIG. 2(B)), the operator makes designations in such a manner that two opposing sides 244a and 244b of the correction region 244 cross over at two points (i.e. points P6 and P7) with the normal line pattern 241 and at two points with the normal line pattern 242 (i.e. P8 and P9). The coordinates of these points P6, P7 and P8 are designated by the operator.

The method for designating regions and coordinates etc. in the case of clear defects is substantially the same as for the opaque defect patterns shown in FIG. 2.

When designation of the correction region and the coordinate points is complete, the CPU 140 automatically determines a region to be subjected to etching or deposition in the following manner using this designation information (S308).

In the case of a spot pattern, regions where defects exist are taken to be processing regions as is, i.e. in the case of an opaque defect, a region where light blocking film exists is extracted from a correction region using image information sensed by the secondary ion detector 130 and takes this to be a processing region. In the case of a clear defect, a region where light blocking film does not exist is extracted from a correction region and taken as a processing region.

In the case of a line pattern, first, a straight line (coinciding with side 221a of FIG. 2) passing through the points P1 and P2 is obtained and it is determined whether this straight line is a boundary line of the normal pattern 221 and the defect 222. Next, the correction region 223 is divided along this boundary line 221a. In the case of an opaque defect, the region of the two divided regions which is entirely covered by the light blocking film is then determined to be a normal pattern. The other divided region on which light blocking film exists is then taken to be a processing region. On the other hand, in the case of a clear defect, the region of the two divided regions on which there is no light blocking film at all is then determined to be a normal pattern. The other divided region on which there is no light blocking film is then taken to be a processing region.

In the case of a corner pattern, it is determined whether or not the boundary line divides the normal pattern 221 and the defect 222 using a straight line passing through the point P3, a straight line passing through the points P4 and P5, and angle information. In the case of an opaque defect, the region of the two divided regions completely covered in light blocking film is determined to be a normal pattern, and the other region, of the divided regions, for which light blocking film exists, is taken to be a processing region. On the other hand, in the case of a clear defect, the region of the two divided regions which has no light blocking film is determined to be a normal pattern, and the other region, of the divided regions, for which light blocking film exists, is taken to be a processing region. In the case of a bridge pattern, regions other than a rectangular region with apexes of the points P6, P7, P8 and P9 are determined to be a normal pattern. In the case of opaque defects, regions of the rectangular region taking the points P6, P7, P8 and P9 as apexes for where light blocking film exists are taken to be processing regions. On the other hand, regions of the rectangular region on which there is no light blocking film are then taken to be processing regions.

When the processing region is decided, the CPU 140 displays this processing region on the monitor 150 and obtains confirmation from the operator (S309). The operator then confirms whether or not the determination of the processing region is correct on the monitor 150 and inputs the results of this confirmation into the CPU 140 using the input unit 160.

When the determination of the processing region is correct, the CPU 140 sends information indicating this processing region to the focussed ion beam apparatus 110.

Finally, processing is executed by the focussed ion beam apparatus 110 (step S310). In this process, in the case of an opaque defect, light blocking film in the processing region is removed by etching. Further, in the case of clear defects, light blocking film forming material is deposited at the processing region.

On the other hand, steps S306 to S309 are not executed when the operator determines that the defect is a defect that does not coincide with any of the defect patterns (refer to FIG. 2). In this case, the operator designates a processing region using a manual operation similar to that of the related art (S311). Further, in step S309, the operator can also designate processing regions by manual operation in a similar manner to the related art (S311) when determination of a processing region is inputted in an erroneous manner. When a surrounding region is designated in a manual operation, the CPU 140 sends information indicating this processing region to the focussed ion beam apparatus 110. Processing is then executed by the focussed ion beam apparatus 110 (step S310), and finally, correction of the defect is complete.

In this embodiment, an operator can correct a photomask simply by designating a large correction region, designating coordinates for 0 to 4 points, and designating an angle, i.e. according to this embodiment, it is possible to substantially alleviate the workload placed upon an operator.

As described in detail above, according to the photomask correction apparatus of this invention, the workload placed on an operator when correcting defects can be substantially alleviated.

What is claimed is:

1. A photomask correction apparatus for correcting defects on a photomask, the photomask correcting apparatus comprising:

storage means for storing positional relationships of defects and normal regions of a photomask for at least one type of defect pattern;

detecting means for detecting a defect on the photomask and for generating image information corresponding to the detected defect;

determining means for determining a correction region of the photomask occupied by the defect detected by the detecting means using the positional relationships from the storage means and the image information from the detecting means; and correcting means for correcting the defect in the correction region determined by the determining means.

2. A photomask correction apparatus according to claim 1; further comprising display means for displaying the image information and the defect pattern.

3. A photomask correction apparatus according to claim 2; further comprising input means for selecting the defect pattern.

4. A photomask correction apparatus according to claim 3; further comprising input means for selecting the correction region of the photomask.

5. A photomask correction apparatus according to claim 4; wherein the at least one type of defect pattern corresponding to positional relationships stored in the storage means comprises at least one of a pattern where a side of the correction region and a side of a normal region do not intersect, a pattern where two facing sides of the correction region intersect with a side of a normal region at one point, a pattern where two neighboring sides of the correction region intersect at one point with two neighboring sides of a normal region, and a pattern where two facing sides of the correction region intersect at two points with a side facing a normal region at two locations.

6. A photomask correction apparatus according to claim 1; further comprising input means for selecting the defect pattern.

7. A photomask correction apparatus according to claim 1; further comprising input means for selecting the correction region of the photomask.

8. A photomask correction apparatus according to claim 1; wherein the at least one type of defect pattern corresponding to positional relationships stored in the storage means comprises at least one of a pattern where a side of the correction region and a side of a normal region do not intersect, a pattern where two facing sides of the correction region intersect with a side of a normal region at one point, a pattern where two neighboring sides of the correction region intersect at one point with two neighboring sides of a normal region, and a pattern where two facing sides of the correction region intersect at two points with a side facing a normal region at two locations.

9. A photomask correction apparatus according to claim 2; further comprising input means for selecting the correction region of the photomask.

10. A photomask correction apparatus comprising:

storage means for storing information corresponding to a plurality of defect patterns;

detecting means for detecting a defect on a surface of a photomask and for outputting image information corresponding to the detected defect;

selecting means for selecting one of the defect patterns from the storage means corresponding to the image information outputted from the detecting means;

determining means for determining a region of the surface of the photomask containing the defect in accordance with the image information outputted from the detecting means and the defect pattern selected by the selecting means; and correcting means for correcting the defect in the region determined by the determining means.

11. A photomask correction apparatus according to claim 10; further comprising display means for displaying the image information outputted from the detecting means.

12. A photomask correction apparatus according to claim 10; wherein the detecting means comprises a secondary ion detector.

13. A photomask correction apparatus according to claim 10; wherein the correcting means comprises a focussed ion beam apparatus for processing the region determined by the determining means to correct the defect on the surface of the photomask.

14. A photomask correction apparatus according to claim 10; wherein the plurality of defect patterns corresponding to information stored in the storage means are selected from the group consisting of a pattern where a side of the correction region and a side of a normal region do not intersect, a pattern where two facing sides of the correction region intersect with a side of a normal region at one point, a pattern where two neighboring sides of the correction region intersect at one point with two neighboring sides of a normal region, and a pattern where two facing sides of the correction region intersect at two points with a side facing a normal region at two locations.

15. A photomask correction apparatus comprising:

storage means for storing a plurality of defect patterns;

support means for supporting a photomask;

detecting means for detecting a defect on a surface of the photomask;

generating means for generating an image of the detected defect;

selecting means for selecting one of the defect patterns from the storage means corresponding to the detected defect in accordance with the image of the detected defect;

designating means for designating a region of the surface of the photomask containing the defect as a correction region in accordance with the selected defect pattern; and correcting means for correcting the defect on the surface of the photomask by processing the correction region.

16. A photomask correction apparatus according to claim 15; wherein the detecting means has means for detecting an opaque defect in a light blocking film on the surface of the photomask; and wherein the correcting means includes means for processing the correction region by etching the light blocking film in the correction region.

17. A photomask correction apparatus according to claim 15; wherein the detecting means has means for detecting a clear defect; and wherein the correcting means includes means for processing the correction region by depositing a light blocking film forming material in the correction region.

18. A photomask correction apparatus according to claim 15; wherein the detecting means comprises a secondary ion detector.

19. A photomask correction apparatus according to claim 15; wherein the correcting means comprises a focussed ion beam apparatus.

20. A photomask correction apparatus according to claim 15; wherein the plurality of defect patterns corresponding to information stored in the storage means are selected from the group consisting of a pattern where a side of the correction region and a side of a normal region do not intersect, a pattern where two facing sides of the correction region intersect with a side of a normal region at one point, a pattern where two neighboring sides of the correction region intersect at one point with two neighboring sides of a normal region, and a pattern where two facing sides of the correction region intersect at two points with a side facing a normal region at two locations.

* * * * *